United States Patent [19]
Ferla et al.

[11] Patent Number: 5,221,855
[45] Date of Patent: Jun. 22, 1993

[54] MONOLITHIC VERTICAL-TYPE SEMICONDUCTOR POWER DEVICE WITH A PROTECTION AGAINST PARASITIC CURRENTS

[75] Inventors: Giuseppe Ferla, Catania; Sergio Palara, Acicastello, both of Italy

[73] Assignee: SGS-Thomson Microelectronics s.r.l., Milan, Italy

[21] Appl. No.: 605,447

[22] Filed: Oct. 30, 1990

[30] Foreign Application Priority Data

Nov. 17, 1989 [IT] Italy .................. 22428 A/89

[51] Int. Cl.$^5$ ........................................ H01L 29/34
[52] U.S. Cl. ........................................ 257/503; 257/548
[58] Field of Search .............. 357/53; 257/503, 544, 257/488, 489, 490, 491, 494, 495, 547, 548

[56] References Cited

U.S. PATENT DOCUMENTS

| | | | |
|---|---|---|---|
| 3,517,280 | 6/1970 | Rosier | 357/48 |
| 4,106,048 | 8/1978 | Khajezadeh | 357/40 |
| 4,174,562 | 11/1979 | Sanders et al. | 357/48 |
| 4,466,011 | 8/1984 | Van Zanten | 357/48 |
| 4,578,695 | 3/1986 | Delaporte et al. | 357/48 |
| 4,641,171 | 2/1987 | Bertotti et al. | 357/48 |
| 4,825,278 | 4/1989 | Hillenius et al. | 357/53 |
| 4,864,379 | 9/1989 | Schade, Jr. | 357/53 |
| 4,883,772 | 11/1989 | Cleeves et al. | 437/200 |
| 4,903,095 | 2/1990 | Chapron | 357/23.13 |
| 4,977,476 | 12/1990 | Marshall et al. | 361/18 |
| 4,999,684 | 3/1991 | Temple | 357/53 |

FOREIGN PATENT DOCUMENTS 2531573 2/1984 France .

Primary Examiner—Andrew J. James
Assistant Examiner—Sara W. Crane
Attorney, Agent, or Firm—Griffin Butler Whisenhunt & Kurtossy

[57] ABSTRACT

A monolithic vertical-type semiconductor power device comprises an N+ type substrate 1 over which there is superimposed an N— type epitaxial layer 2 in which there is obtained a P type isolation pocket 3. The pocket 3 contains N type regions 4, 15 and P type regions 6 which in turn contain N+ type regions 11, 12 and P type regions 7, 9, 10 which define circuit components of the device. Isolation pocket 3 is wholly covered by a first metallisation 21 connect to ground. The metallisation 21 is in turn protected by a layer of insulating material 18 suitable for allowing the crossing of metal tracks or of a second metallisation for the connection of the different components.

14 Claims, 4 Drawing Sheets

MONOLITHIC VERTICAL-TYPE SEMICONDUCTOR POWER DEVICE WITH A PROTECTION AGAINST PARASITIC CURRENTS

BACKGROUND

1. Field of the Invention

The present invention relates to a monolithic vertical-type semiconductor power device with a protection against parasitic currents.

2. Prior Art and Other Considerations

A vertical-type semiconductor integrated structure comprises essentially an N+ type substrate over which there is superimposed an N− type epitaxial layer in which there is obtained, a P type isolation pocket with protruding extremities, connected to ground. The isolation pocket contains N type regions which include P and N+ type regions which define circuit components of the device. On the bottom of the N regions there are also N+ type regions.

With the circuit's active components there are associated parasite components which switch on when the circuit's active components associated with them are switched on, and inject current in the central part of isolation pocket P.

The injected current flows through the isolation pocket and reaches the grounded metallic terminal.

If such terminal is far from the injection area, the isolation pocket itself rises in voltage since the resistive path which the current must follow to reach the grounded terminal is longer.

Such a voltage rise, which can be even of some volts, can jeopardize the operation of the integrated circuit.

In addition, in the case in which the N+ type substrate goes to a low voltage while the isolation pocket rises in voltage, a parasite junction diode between such regions enters into conduction injecting current into the substrate and thus jeopardizing the operation of the whole.

From such circuit behavior it is possible to understand the need for grounding pocket P at as many points as possible. Such problem is generally solved by connecting between them a substantial number of ground contacts on isolation pocket P by means of a metal track which is then grounded. Such a process is that much more complicated the greater is the number of ground contacts made and requires a substantial size since the metal ground tracks must be compatible with the several connection tracks of the different circuit elements.

The object of the present invention is to overcome the abovementioned drawbacks caused by the presence of selective ground contacts of the isolation pocket.

SUMMARY

According to the invention such object is attained with a monolithic vertical-type semiconductor power device comprising an N+ type substrate in which there is obtained a P type isolation pocket with extremities protruding over the surface of the substrate, which in turn contains N type regions and P type regions for the containment of N+ type regions and of P type regions which define circuit components of the device, characterized in that said protruding extremities of the isolation pocket are wholly covered by a first metallisation connected to ground.

In this way the resistive path between the area of injection of the current into the isolation pocket on the part of the parasite components and the grounded terminal is in any case short and does not originate the drawbacks described above.

BRIEF DESCRIPTION OF THE DRAWINGS

The features of the present invention shall be made more evident by the following detailed description of embodiments illustrated by way of non-limiting examples in the enclosed drawings, wherein.

DETAILED DESCRIPTION OF THE DRAWINGS

Figure 1:
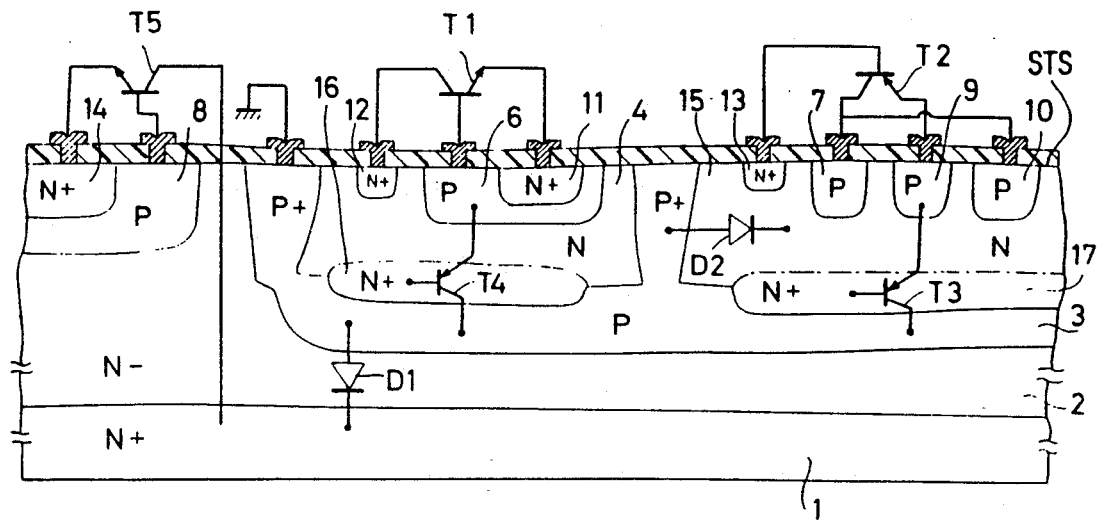
FIG. 1 illustrates a longitudinal sectional view of a monolithic vertical-type semiconductor power device not provided with protection according to the invention.

With reference to FIG. 1 the monolithic power device comprises an N+ type substrate 1 on which there is made to grow an N− type epitaxial layer 2, in which there is obtained a P type isolation pocket 3 with extremities protruding over the surface of the substrate. Region 1 and pocket 3 form a diode D1.

Inside pocket 3 there are obtained N type regions 4, 15 for the containment of the circuit's active components. Inside region 4 there are obtained a P type region 6 and N+ type regions 11, 12. Region 12 constitutes the collector of a transistor T1 whose emitter is accomplished in region 11 and whose base is accomplished in region 6. Inside region 15 there are obtained P type regions 7, 9, 10, and an N+ type region 13. Region 13 constitutes the base of a transistor T2 whose collector is accomplished in region 7, in turn connected to region 10, and whose emitter is accomplished in region 9. Between region 15 and pocket 3 there is also accomplished a diode D2.

FIG. 1 shows a semiconductor material top surface STS to which extend the vertically highest extending semiconductor regions. For example, the upper portions of regions 14, 8, 2, 3, 4, 12, 6, 11, 15, 13, 7, 9, and 10 extend to the semiconductor material top surface STS but are essentially vertically terminated in a plane forming the semiconductor material top surface STS. Thus, none of the semiconductor regions (e.g., the N+, N−, N, P, P+ regions) extend vertically above the semiconductor material top surface STS.

On the bottom of regions 4, 15 there are obtained N+ type regions 16, 17. Such regions 16, 17 constitute the bases of a first parasite transistor T4 (whose emitter is accomplished in region 6 and whose collector is accomplished in pocket 3 and of a second parasite transistor T3 whose emitter is accomplished in the P type region 9 and whose collector is accomplished in pocket 3).

In addition, inside the epitaxial layer 2 there is obtained a P type region 8 and inside this an N+ type region 14. Region 8 constitutes the base of a power transistor T5, whose emitter is accomplished in region 14 and whose collector is accomplished in epitaxial layer 2 until it reaches substrate 1.

With reference to the operation of the circuit illustrated in FIG. 1, when transistor T2 is on, the parasite transistor T3 corresponding to it is also on; when transistor T1 is in saturation, parasite transistor T4 corresponding to its is active.

When parasite transistors T3 and T4 are on they inject current into isolation pocket P, region 3. Such a current flows through insulation pocket 3, and reaches the grounded terminal. If this terminal is far from the area where the current is injected into the insulation pocket, the pocket rises in voltage since the resistive path which the current must follow to reach the ground terminal is longer.

The voltage rise of isolation pocket P can be even of some volts, when the N type regions 4, 15 contained in isolation pocket P go to a low voltage, the conduction of parasite transistors T3, T4 can jeopardize the operation of the integrated circuit.

The voltage rise of isolation pocket P in combination with the drop in voltage in the N type region 15 causes moreover the conduction of diode D2.

Substrate 1, used as the collector of vertical power transistor T5, can also go to a very low voltage at the saturation point of the transistor. If between substrate 1 and isolation pocket 3 there is a voltage difference that is higher than the threshold conduction voltage of diode D1, the latter goes into conduction and jeopardizes the operation of the entire circuit.

Figure 2:
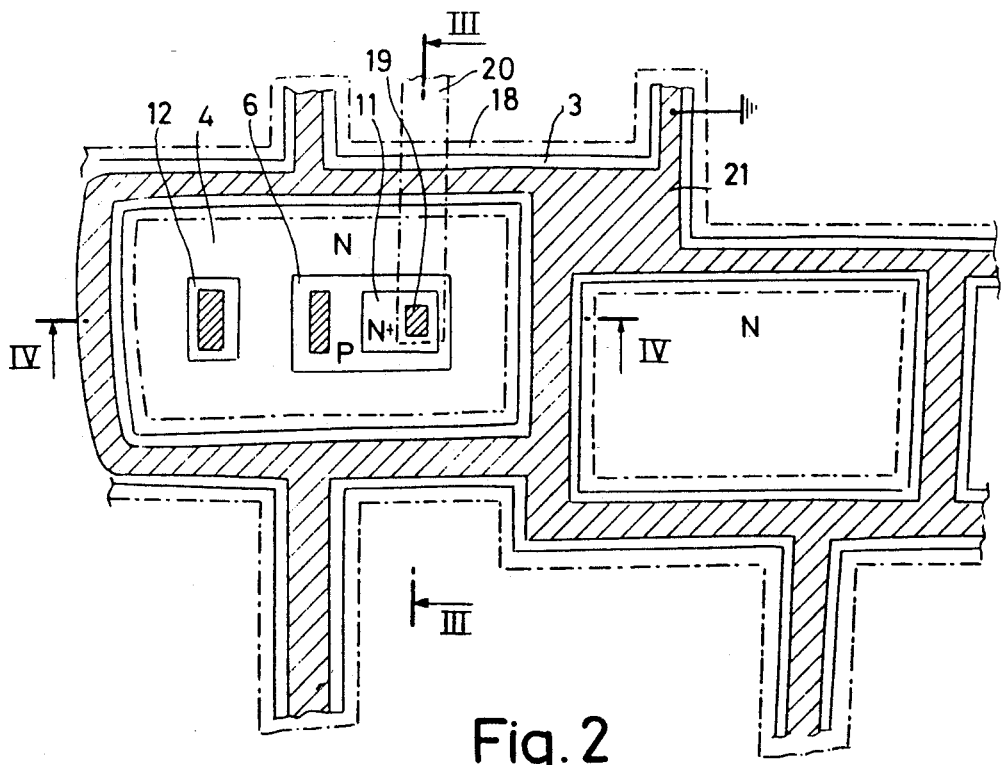
FIG. 2 shows a top plan view of a first embodiment of the monolithic power device according to the invention, provided with protection against parasitic currents.
Figure 3:
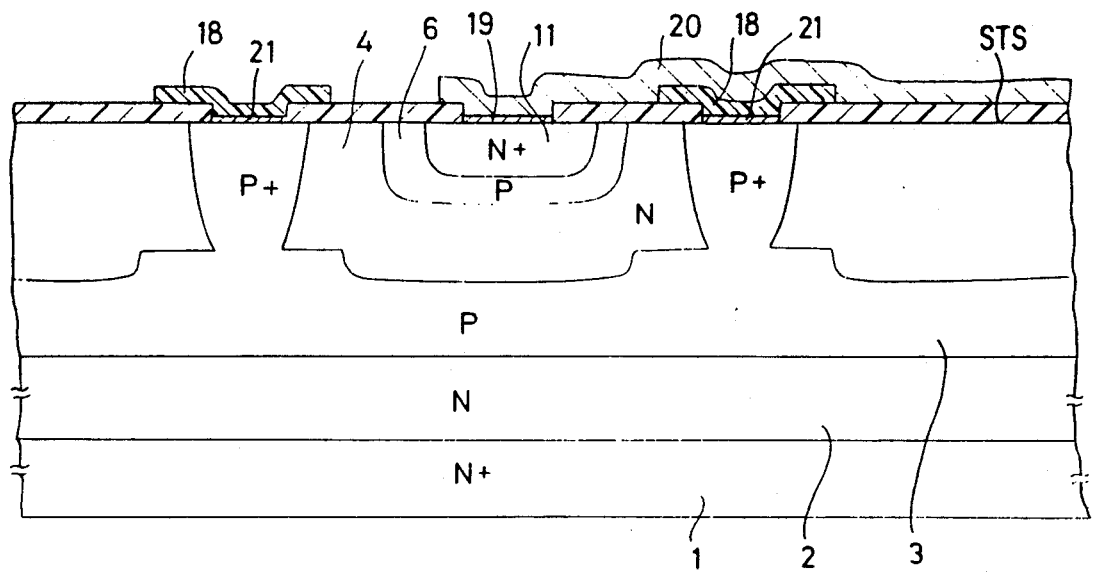
FIG. 3 is a sectional view of FIG. 2 taken along the line III—III.
Figure 4:
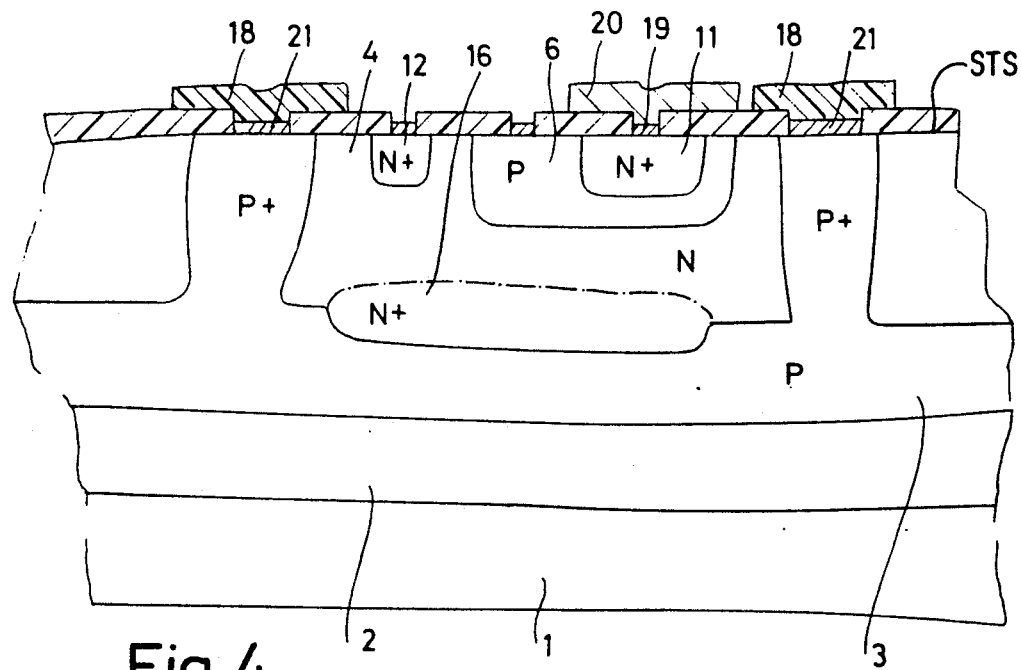
FIG. 4 is a sectional view of FIG. 2 taken along the line IV—IV.

To overcome the voltage rise in isolation pocket P caused by the existence of the parasite transistors, with reference to FIGS. 2, 3, 4, the protruding extremities of isolation pocket P are, according to the invention, wholly covered by a metallisation 21, say a layer of metal polysilicide, preferably of platinum, whose resistance is approximately 1 ohm per square, that is about 100 times lower than the resistance per square of isolation pocket P. Some areas of isolation pocket P are reached and contacted by metal tracks of aluminum, not shown, connected to ground according to the prior art.

As shown in FIG. 2, the metallisation 21 is an essentially continuous layer (e.g., no isolated or unconnected portions) which contacts and substantially wholly covers the portion of the P type insulation pocket which vertically extend to the semiconductor material top surface STS. As indicated above, the continuous metallisation 21 is connected to an electrical ground.

In this way the leakage currents of parasite transistors T3, T4 are conveyed to ground through low-resistivity paths and thus there is no rise in voltage in isolation pocket P.

Metallisation 21 is in turn covered by an isolating layer 18, say, silicon oxide, to allow the crossing of metallisation 21 on the part of metal tracks 20 connecting the different circuit elements of the integrated circuit, reached at bump contacts 19.

Figure 5:
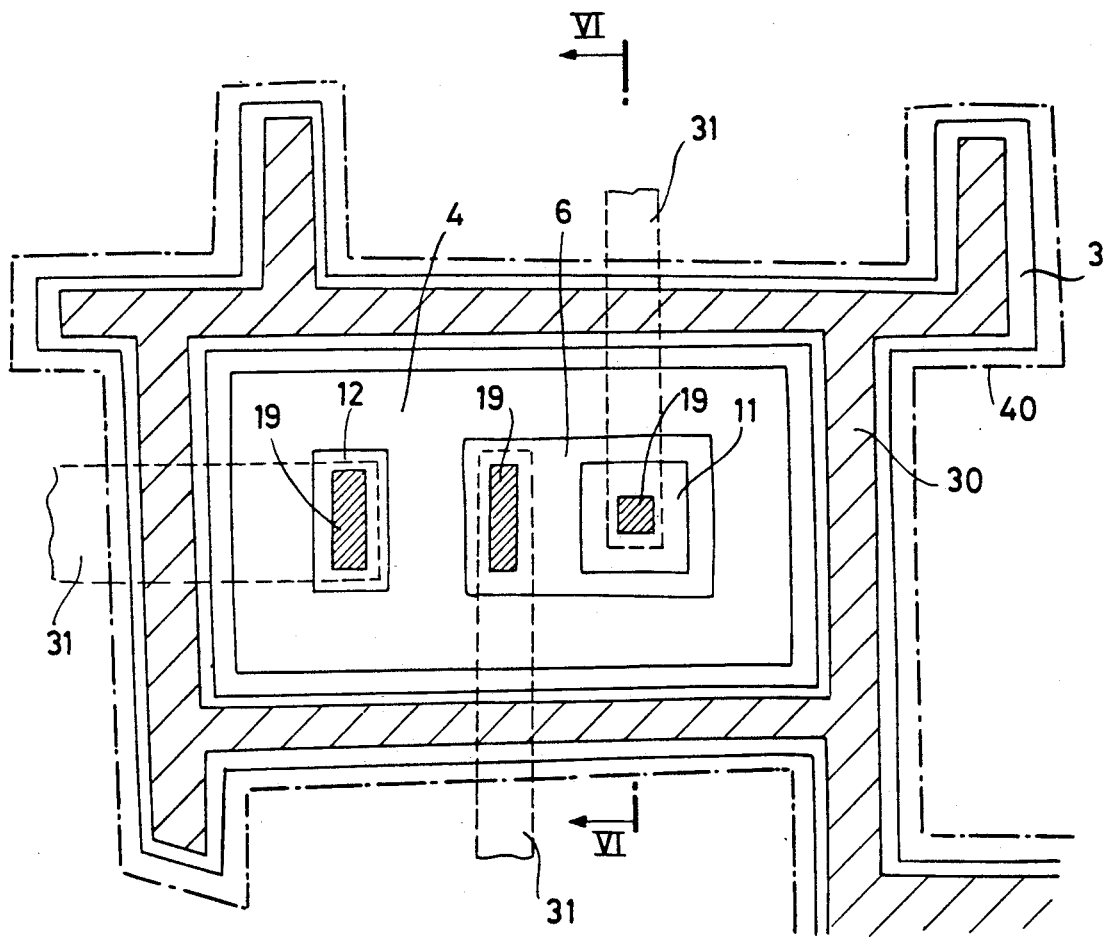
FIG. 5 is a top plan view of a second embodiment of the monolithic power device according to the invention.
Figure 6:
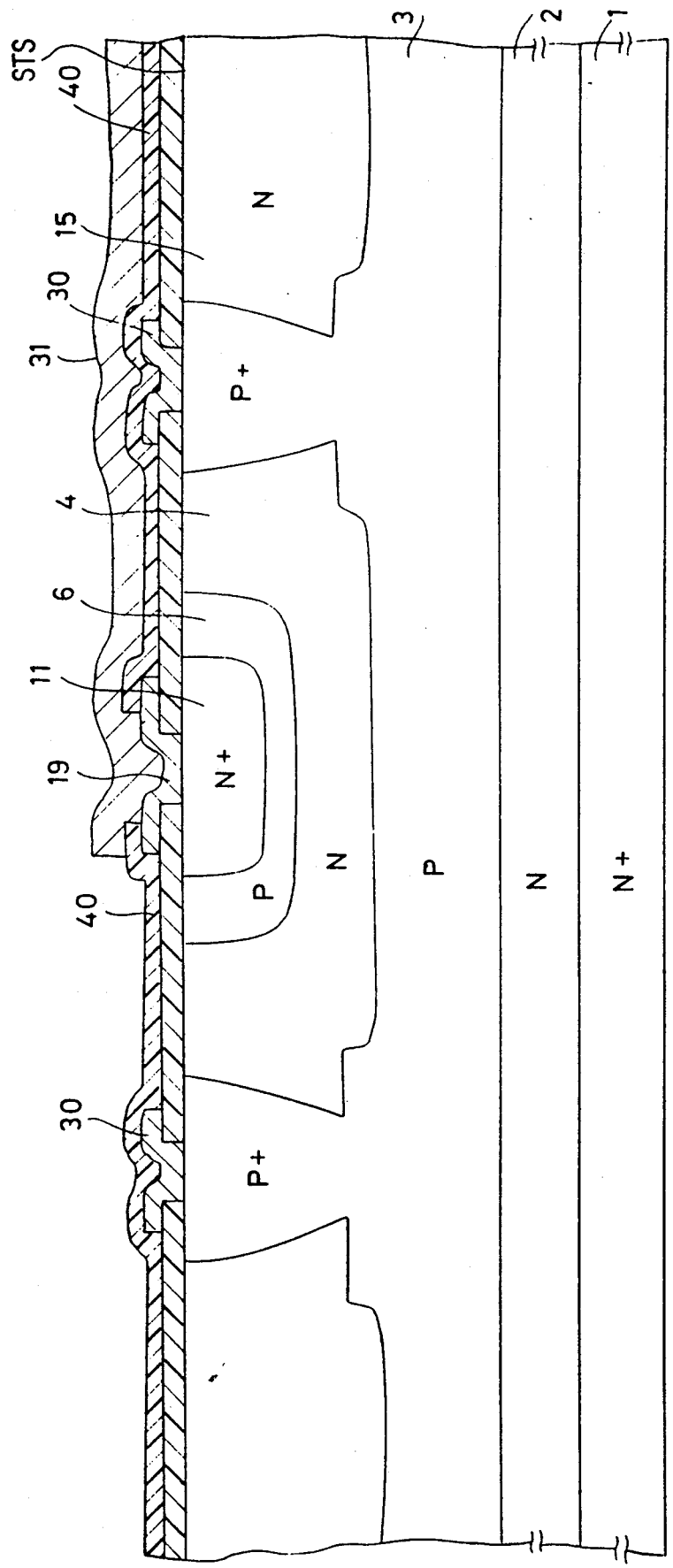
FIG. 6 is a sectional view of FIG. 5 taken along the line VI—VI.

With reference to FIGS. 5 and 6 an alternative embodiment of the device according to the invention provides for the deposition, over the protruding extremities of isolation pocket P, of a first metallisation 30 suitable for forming the grounding network, over which there are superimposed an insulation layer 40 and a second metallisation 31 connecting the different circuit elements of the integrated circuit. Both metallisations are preferably accomplished in aluminum, while for the insulation layer silicon oxide is preferably used.

We claim:

1. A monolithic vertical-type semiconductor power device comprising:
    an N+ type substrate upon which there is a P type isolation region, the P type isolation region in turn having N type regions provided therein the N type regions having provided therein further semiconductor regions for defining circuit components of the device, portions of the P type isolation region vertically extending above the substrate to a semiconductor material top surface in an irregular pattern in the plane of the top surface whereat the vertically highest extending semiconductor regions of the device are essentially terminated and a first continuous metallisation, contacting and substantially wholly covering the portions of the P type isolation region which vertically extend to the semiconductor material top surface, the continuous metallisation being connected to an electrical ground.

2. A device according to claim 1, characterized in that said first metallisation is accomplished in metal silicide.

3. A device according to claim 2, characterized in that said first metallisation is accomplished in platinum silicide.

4. Device according to claim 1 characterized in that said first metallization is covered by a layer of isolating material.

5. A device according to claim 4 characterized in that said layer of isolating material is accomplished in silicon oxide.

6. A device according to claim 4, characterized in that on the layer of isolating material there are metal tracks connecting the different circuit elements.

7. A device according to claim 6, characterized in that said metal connecting tracks are accomplished in aluminum.

8. A device according to claim 4, characterized in that on the layer of isolating material there is a second metallisation connecting the different circuit elements.

9. A device according to claim 8, characterized in that said second metallisation is accomplished in aluminum.

10. A device according to claim 1, characterized in that said isolating region is obtained in an epitaxial layer superimposed over said substance.

11. A monolithic vertical-type semiconductor power device comprising:
    an N+ type substrate;
    a P type region provided above the substrate, with portions of the P type region vertically extending above the substrate to a semiconductor material top surface in an irregular pattern in the plane of the top surface whereat the vertically highest semiconductor regions of the device are essentially vertically terminated;
    an N type region wherein are provided further semiconductor regions for defining active circuit components, the N type region being electrically isolated by the P type region, the N type region and further semiconductor regions not extending above the semiconductor material top surface;
    an essentially continuous metallisation contacting and substantially wholly covering the portions of the P type region which vertically extend to the semiconductor material top surface, the metallisation being connected to an electrical ground.

12. A monolithic vertical-type semiconductor power device comprising:
   an N+ type substrate;
   a P type region provided above the substrate, the P type region serving as a first element of a parasitic transistor, with portions of the P type region vertically extending above the substrate to a semiconductor material top surface in an irregular pattern in the plane of the top surface whereat the vertically highest semiconductor regions of the device are essentially vertically terminated;
   an N type region provided in the P type region and wherein are provided further semiconductor regions including a further P type region which serves as a second element of the parasitic transistor, the n type region being electrically insulated by the P type region which serves as the first element of the parasitic transistor, the N type region and further semiconductor regions not extending above the semiconductor material top surface;
   an essentially continuous metallisation contacting and substantially wholly covering the portions of the P type region which vertically extend to the semiconductor material top surface, the metallisation being connected to an electrical ground for limiting a resistive path in the P type region serving as the first element of the parasitic transistor for current injected therein by the parasitic transistor.

13. The device of claim 12, wherein the first element of the parasitic transistor is a collector and the second element of the parasitic transistor is an emitter.

14. A monolithic vertical-type semiconductor power device comprising an N+ type substrate upon which there is a P type isolation region the P type isolation region in turn having N type regions provided therein, the N type regions having provided therein further semiconductor regions for defining circuit components of the device, portions of the P type isolation region vertically extending above the substrate to a semiconductor material top surface in an irregular pattern in the plane of the top surface whereat the vertically highest extending semiconductor regions of the device are essentially terminated, and a first metallisation contacting and substantially wholly covering the portions of the P type isolation region which vertically extend to the semiconductor material top surface, the continuous metallisation being connected to a potential other than ground.

* * * * *